United States Patent
Tung et al.

(10) Patent No.: US 9,583,627 B2
(45) Date of Patent: Feb. 28, 2017

(54) SEMICONDUCTOR DEVICE AND METHOD FOR FABRICATING THE SAME

(71) Applicant: UNITED MICROELECTRONICS CORP., Hsin-Chu (TW)

(72) Inventors: Yu-Cheng Tung, Kaohsiung (TW); En-Chiuan Liou, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/793,721

(22) Filed: Jul. 7, 2015

(65) Prior Publication Data
US 2016/0365452 A1    Dec. 15, 2016

(30) Foreign Application Priority Data
Jun. 9, 2015   (CN) .......................... 2015 1 0311866

(51) Int. Cl.
| H01L 29/06 | (2006.01) |
| H01L 29/165 | (2006.01) |
| H01L 29/78 | (2006.01) |
| H01L 29/66 | (2006.01) |
| H01L 21/324 | (2006.01) |
| H01L 29/167 | (2006.01) |
| H01L 21/306 | (2006.01) |
| H01L 21/02 | (2006.01) |

(52) U.S. Cl.
CPC .... *H01L 29/7853* (2013.01); *H01L 21/02532* (2013.01); *H01L 21/30604* (2013.01); *H01L 21/324* (2013.01); *H01L 29/0649* (2013.01); *H01L 29/167* (2013.01); *H01L 29/66795* (2013.01); *H01L 29/7834* (2013.01); *H01L 29/7851* (2013.01)

(58) Field of Classification Search
CPC ............ H01L 29/7853; H01L 29/7834; H01L 29/7851; H01L 29/167; H01L 29/66795; H01L 29/0649; H01L 21/02532; H01L 21/30604; H01L 21/324
USPC ... 257/77, 192, 401, 408, E29.084, E29.242, 257/E21.09, E21.218; 438/283, 285, 478, 438/479
See application file for complete search history.

(56) References Cited

U.S. PATENT DOCUMENTS

| 7,101,761 B2 | 9/2006 | Chau et al. |
| 7,176,504 B1 | 2/2007 | Lin et al. |
| 7,545,023 B2 | 6/2009 | Chien |
| 8,207,523 B2 | 6/2012 | Tsai et al. |
| 8,269,209 B2 | 9/2012 | Shah et al. |
| 8,399,314 B2 | 3/2013 | Cohen et al. |
| 8,623,728 B2 | 1/2014 | Chang et al. |
| 8,659,032 B2 | 2/2014 | Chao et al. |

(Continued)

*Primary Examiner* — Dao H Nguyen
(74) *Attorney, Agent, or Firm* — Winston Hsu; Scott Margo

(57) ABSTRACT

A method for fabricating semiconductor device is disclosed. The method includes the steps of: providing a substrate having at least a fin-shaped structure thereon and the fin-shaped structure includes a top portion and a bottom portion; forming a gate structure on the fin-shaped structure; forming a cap layer on the top portion of the fin-shaped structure not covered by the gate structure; performing an annealing process to drive germanium from the cap layer to the top portion of the fin-shaped structure; removing the cap layer; and forming an epitaxial layer around the top portion of the fin-shaped structure.

8 Claims, 6 Drawing Sheets

(56) References Cited

U.S. PATENT DOCUMENTS

| | | | |
|---|---|---|---|
| 8,796,695 B2* | 8/2014 | Liao | H01L 29/66484 |
| | | | 257/190 |
| 8,906,768 B2 | 12/2014 | Wong et al. | |
| 8,975,144 B2 | 3/2015 | Kwok et al. | |
| 8,980,719 B2 | 3/2015 | Tsai et al. | |
| 8,993,419 B1 | 3/2015 | Zhang et al. | |
| 2008/0237575 A1 | 10/2008 | Jin et al. | |
| 2014/0077229 A1* | 3/2014 | Liu | H01L 29/66795 |
| | | | 257/77 |
| 2014/0357049 A1 | 12/2014 | Wu et al. | |
| 2015/0069473 A1 | 3/2015 | Glass et al. | |
| 2015/0069527 A1 | 3/2015 | Kerber et al. | |
| 2015/0069531 A1 | 3/2015 | Naczas et al. | |
| 2015/0091099 A1 | 4/2015 | Ching et al. | |
| 2016/0099352 A1* | 4/2016 | Lee | H01L 29/7851 |
| | | | 257/192 |
| 2016/0126343 A1* | 5/2016 | Ching | H01L 29/785 |
| | | | 257/192 |

\* cited by examiner

SEMICONDUCTOR DEVICE AND METHOD FOR FABRICATING THE SAME

BACKGROUND OF THE INVENTION

1. Field of the Invention

The invention relates to a method for fabricating semiconductor device, and more particularly, to a method of using annealing process to drive germanium into fin-shaped structure.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

Nevertheless, conventional FinFET fabrication of forming recesses after removing part of fin-shaped structures to accommodate the growth of epitaxial layer typically causes the fin-shaped structures to be lower than the surrounding shallow trench isolation (STI) as a result of over-etching, thereby influencing the formation of epitaxial layer afterwards. Hence, how to improve the current FinFET fabrication process for resolving this issue has become an important task in this field.

SUMMARY OF THE INVENTION

According to a preferred embodiment of the present invention, a method for fabricating semiconductor device is disclosed. The method includes the steps of: providing a substrate having at least a fin-shaped structure thereon and the fin-shaped structure includes a top portion and a bottom portion; forming a gate structure on the fin-shaped structure; forming a cap layer on the top portion of the fin-shaped structure not covered by the gate structure; performing an annealing process to drive germanium from the cap layer to the top portion of the fin-shaped structure; removing the cap layer; and forming an epitaxial layer around the top portion of the fin-shaped structure.

According to another aspect of the present invention, a method for fabricating semiconductor device is disclosed. The method includes the steps of: providing a substrate having at least a fin-shaped structure thereon and the fin-shaped structure includes a top portion and a bottom portion and the top portion and the bottom portion comprise different material; performing a wet clean to alter the shape of the top portion of the fin-shaped structure; and forming a first epitaxial layer around the top portion of the fin-shaped structure.

According to another aspect of the present invention, a semiconductor device is disclosed. The semiconductor device includes: a substrate; at least a fin-shaped structure on the substrate and the fin-shaped structure includes a top portion and a bottom portion; and a gate structure on the substrate and the fin-shaped structure. Preferably, the fin-shaped structure covered by the gate structure and the fin-shaped structure not covered by the gate structure comprise different shape, and the fin-shaped structure not covered by the gate structure is smaller than the fin-shaped structure covered by the gate structure.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
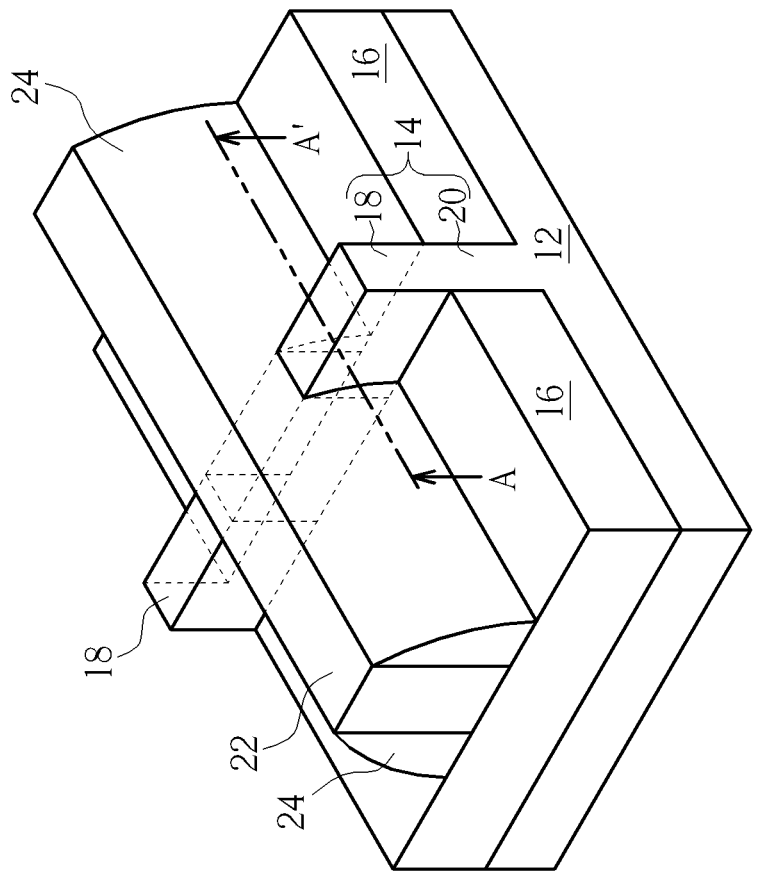
FIGS. 1-6 illustrate a method for fabricating semiconductor device according to a preferred embodiment of the present invention.
Figure 1:
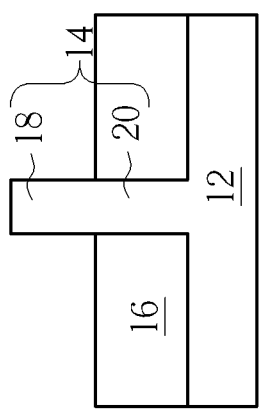

Referring to FIGS. 1-6, FIGS. 1-6 illustrate a method for fabricating semiconductor device according to a preferred embodiment of the present invention, in which the right hand portion of each figure illustrates a 3-dimensional view of a fin-shaped structure transistor of the present invention and the left hand portion of each figure illustrates a cross-sectional view of the right hand portion along sectional line AA'. As shown in FIG. 1, a substrate 12, such as silicon substrate or silicon-on-insulator (SOI) substrate is provided, at least one fin-shaped structure 14 is formed on the substrate 12, and a shallow trench isolation (STI) 16 is formed to surround the fin-shaped structure 14. In this embodiment, the fin-shaped structure 14 preferably includes a top portion 18 and a bottom portion 20, in which the intersection of the top portion 18 and bottom portion 20 is aligned with the surface of STI 16, and the bottom surface of the top portion 18 or the top surface of the bottom portion 20 are equivalent in size as both surfaces are aligned with the STI 16 surface. Despite only one single fin-shaped structure 14 is disclosed in this embodiment, it would also be desirable to form one or more fin-shaped structures 14 on the substrate 12 according to the demand of the product.

The fin-shaped structure 14 of this embodiment are preferably obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structure 14 of this embodiment could also be obtained by first forming a patterned mask (not shown) on the substrate, 12, and through an etching process, the pattern of the patterned mask is transferred to the substrate 12 to form the fin-shaped structure 14. Moreover, the formation of the fin-shaped structure 14 could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structure 14. These approaches for forming fin-shaped structure 14 are all within the scope of the present invention.

Next, a gate structure 22 is formed on the substrate 12 and intersecting the fin-shaped structure 14, a lightly doped drain (not shown) is formed in the fin-shaped structure 14 adjacent to two sides of the gate structure 22, a spacer 24 is formed on the sidewalls of the gate structure 22, and a source/drain region (not shown) is formed in the fin-shaped structure 14 adjacent to two sides of the spacer 24.

Figure 2:
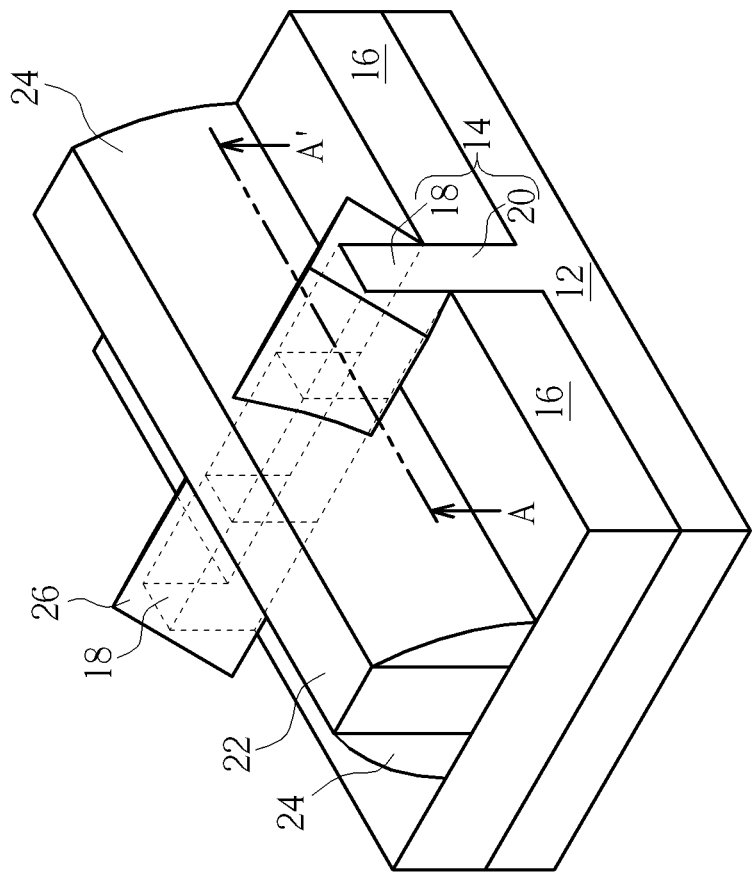
Figure 2:
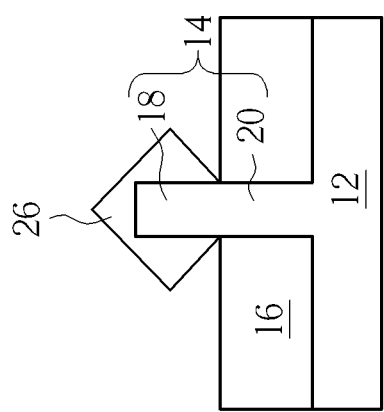

Next, as shown in FIG. 2, a cap layer 26 is covered on the fin-shaped structure 14 adjacent to two sides of the gate structure 22, in which the cap layer 26 preferably covers the exposed top portion 18 of the fin-shaped structure 14 adjacent to two sides of the gate structure 22. In this embodiment, the cap layer 26 is preferably an epitaxial layer formed through selective epitaxial growth process, such as an epitaxial layer composed of germanium oxide (GeO) or silicon germanium (SiGe), and the cap layer 26 is preferably grown according to particular crystalline face so that the cross section of the cap layer 26 preferably reveals a substantially rhombus shape shown in FIG. 2. It should be noted that at this point the top portion 18 of the fin-shaped structure 14 covered by cap layer 26 and the top portion 18 of fin-shaped structure 14 directly under the gate structure 22 still share same shape and size, such as both being rectangular.

Figure 3:
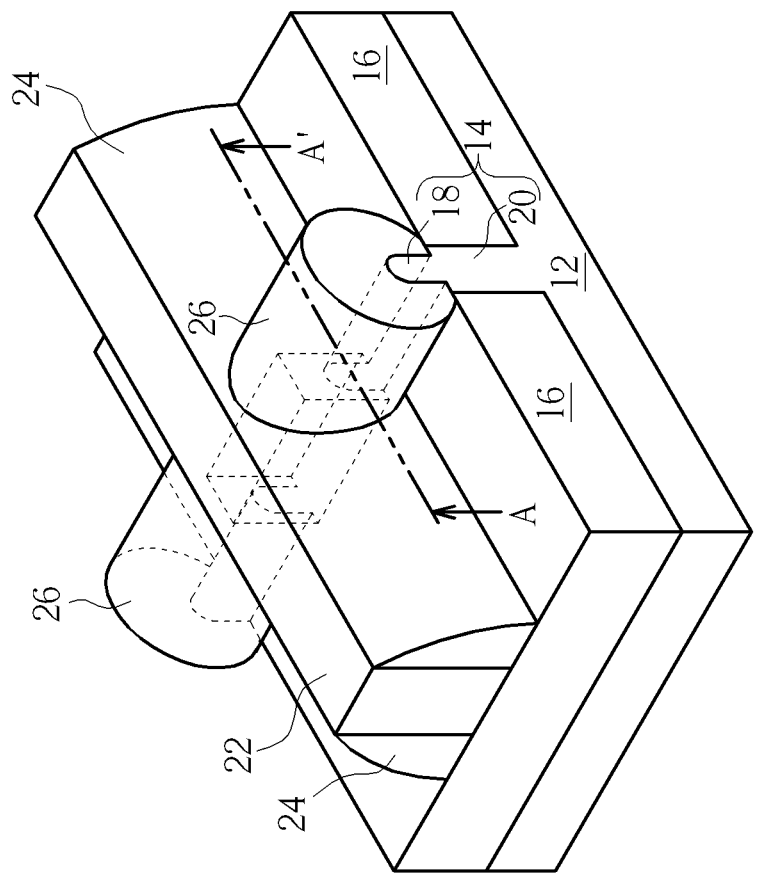
Figure 3:
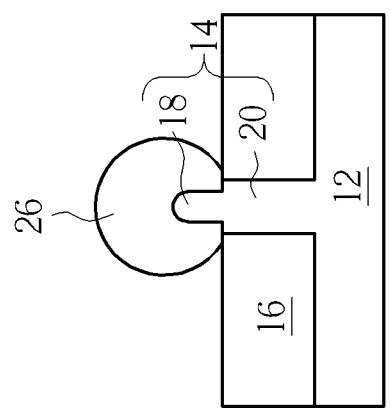

Next, as shown in FIG. 3, an annealing process is conducted to drive germanium atom from the cap layer 26 into the top portion 18 of fin-shaped structure 14 adjacent to two sides of the gate structure 22. This transforms the single crystal top portion 18 of fin-shaped structure 14 into a SiGe structure having a germanium concentration of greater than 50%. In this embodiment, the annealing process preferably alters the rectangular shaped top portion 18 of fin-shaped structure 14 and rhombus-shaped cap layer 26 into portions with substantially circular profile while reducing the size of the top portion 18 at the same time. Preferably, the reduced top portion 18 of fin-shaped structure 14 after the annealing process and the bottom portion 20 share different width, such that the width of bottom surface of the top portion 18 is substantially smaller than the width of top surface of the bottom portion 20.

It should be noted that since part of the fin-shaped structure 14 is covered by the gate structure 22, only the top portion 18 of fin-shaped structure 14 adjacent to two sides of the gate structure 22 is reduced by the annealing process while the top portion 18 of fin-shaped structure 14 directly under the gate structure 22 is unaffected by the annealing process. In other words, the fin-shaped structure 14 is preferably divided into two parts after the annealing process is conducted, in which the top portion 18 (or channel region) of fin-shaped structure 14 directly under the gate structure 22 is unaffected by annealing process thereby maintaining the original rectangular profile and having unchanged height, whereas the top portion 18 (or source/drain region) adjacent to two sides of the gate structure 22 is transformed by annealing process into a portion with circular profile and reduced height.

Figure 4:
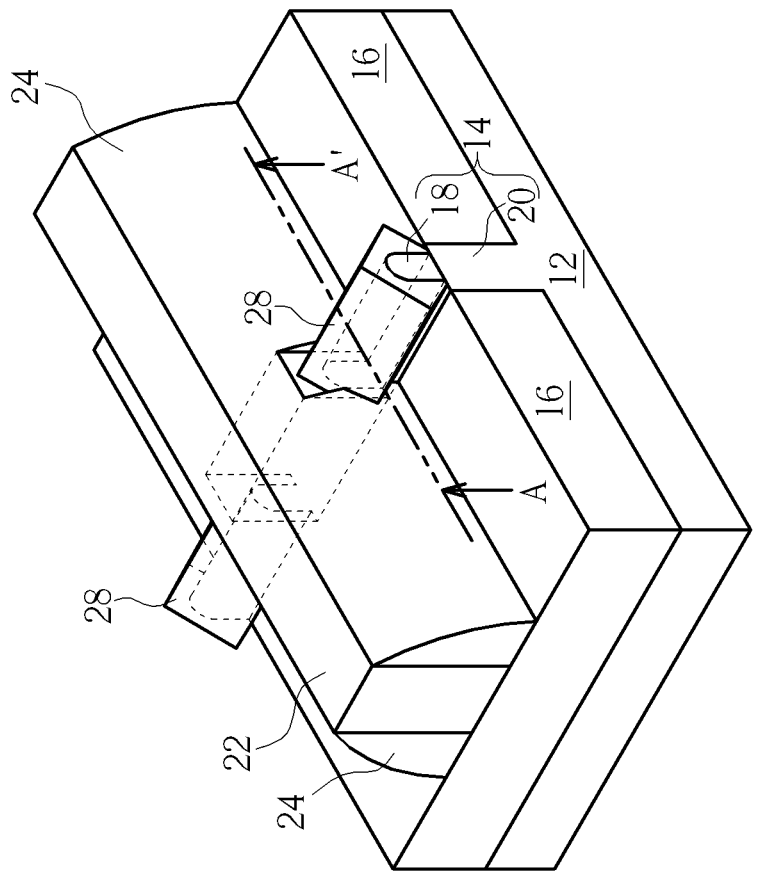
Figure 4:
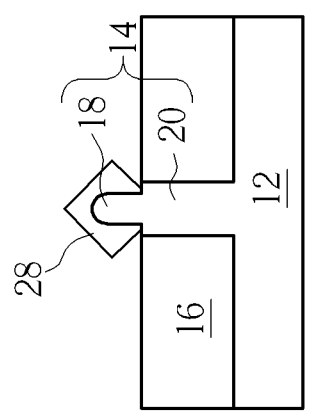

Next, as shown in FIG. 4, the cap layer 26 is removed to expose the top portion 18 of fin-shaped structure 14 adjacent to two sides of the gate structure 22, and an epitaxial layer 28 is selectively formed on the top portion 18 adjacent to two sides of the gate structure 22. Preferably, the epitaxial layer 28 could include a substantially rhombus-shaped cross-section to surround the elliptical top portion 18, in which the epitaxial layer 28 could also be composed of SiGe. This completes the fabrication of a semiconductor device according to an embodiment of the present invention.

Figure 5:
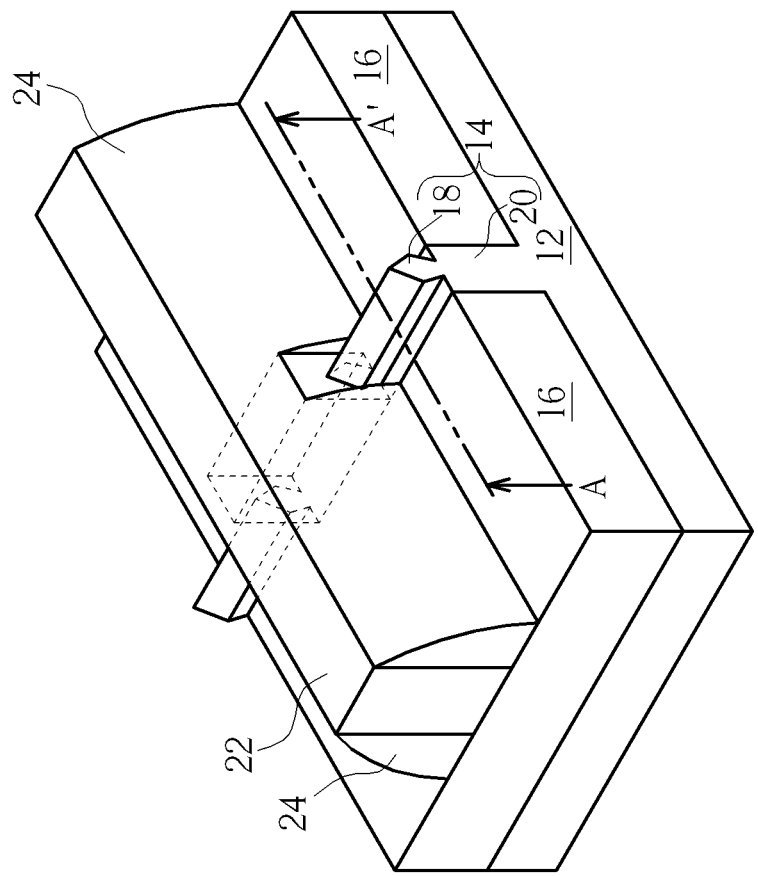
Figure 5:
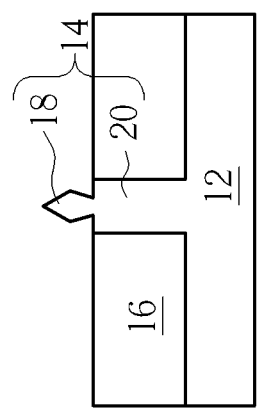

Next, as shown in FIG. 5, another embodiment of the present invention could be accomplished by performing a wet clean or wet etching process to remove the epitaxial layer 28 and part of the top portion 18 adjacent to two sides of the gate structure 22. This transforms the shape of the top portion 18 of fin-shaped structure 14 adjacent to two sides of the gate structure 22 along particular lattice from a substantially circular tip to a substantially rhombus-shaped tip. In this embodiment, the agent used in the wet clean or etching process is selected from the group consisting of tetramethylammonium hydroxide (TMAH), potassium hydroxide (KOH), and ethylenediamine pyrocatechol (EDP), but not limited thereto.

In this embodiment, the size of the top portion 18 of fin-shaped structure 14 adjacent to two sides of the gate structure 22 could be further reduced during the aforementioned clean process. For instance, the height of the top portion 18 shown in FIG. 5 could be lower than the top portion 18 of fin-shaped structure 14 adjacent to two sides of the gate structure 22 shown in FIG. 3 and the width of the top portion 18 shown in FIG. 5 could be smaller than the top portion 18 of fin-shaped structure 14 adjacent to two sides of the gate structure 22 shown in FIG. 3. Similar to the width ratio between top portion 18 and bottom portion 20 adjacent to two sides of gate structure 22 shown in FIG. 3, the top portion 18 and bottom portion 20 of fin-shaped structure 14 adjacent to two sides of gate structure 22 shown in FIG. 5 also share different widths, in which the width of the bottom surface of top portion 18 is preferably less than the width of the top surface of bottom portion 20.

It should be noted that even though an epitaxial layer 28 is formed on the top portion 18 of fin-shaped structure 14 after removing the cap layer 26 and before conducting the wet clean process, it would also be desirable to omit the step of forming the epitaxial layer 28 and conduct the wet clean process directly on the top portion 18 of fin-shapes structure 14 adjacent to two sides of the gate structure 22 for transforming the shape of fin-shaped structure 14, which is also within the scope of the present invention.

Figure 6:
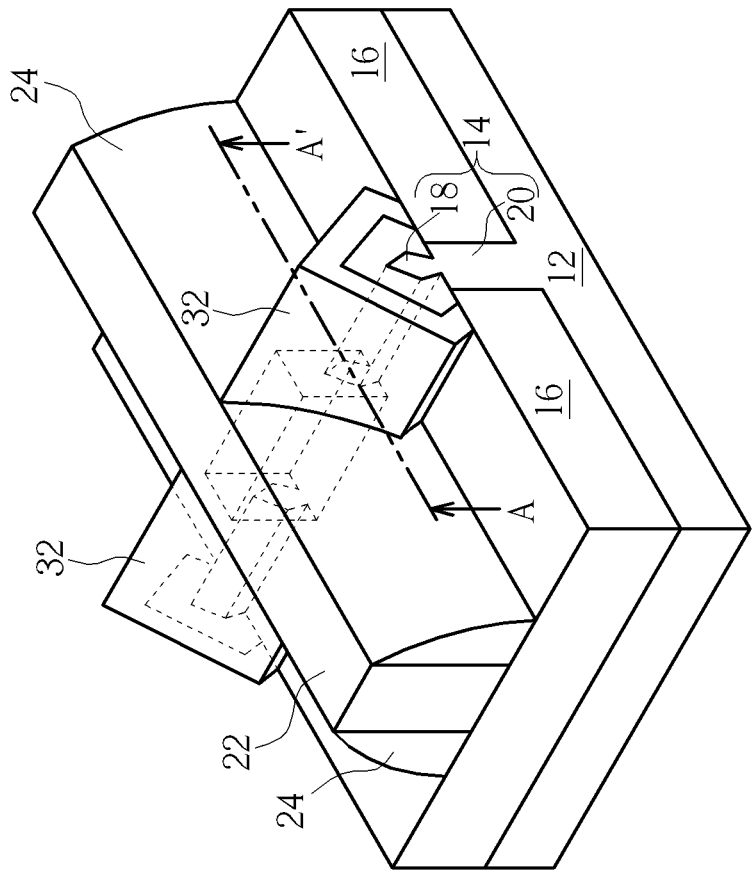
Figure 6:
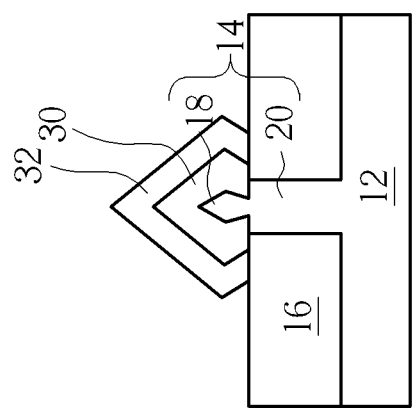

Next, as shown in FIG. 6, an epitaxial layer 30 is formed around the top portion 18 of fin-shaped structure 14 adjacent to two sides of the gate structure 22, in which the epitaxial layer 30 and the top portion 18 adjacent to two sides of the gate structure 22 both being rhombus-shaped. In this embodiment, the epitaxial layer 30 preferably includes germanium, in which the germanium concentration of the epitaxial layer 30 is preferably higher than the germanium concentration of the top portion 18 adjacent to two sides of the gate structure 22. In addition, it would be desirable to in-situ boron to serve as a source/drain region during the formation of epitaxial layer 30 while the top portion 18 adjacent to two sides of the gate structure 22 preferably includes no boron therein. Next, another cap layer 32 composed of epitaxial material is formed to surround the epitaxial layer 30, in which the cap layer 32 also includes germanium and the germanium concentration of the cap layer 32 is even higher than the germanium concentration of the epitaxial layer 30. Next, another cap layer (not shown) composed of silicon could be selectively formed to surround the cap layer 32 thereafter, which is also within the scope of the present invention.

After the epitaxial layer 30 is formed, a doping process and an annealing process could be conducted to form a source/drain region. In other words, a source/drain region could be formed in three time slots throughout the present invention. For instance, a source/drain region could be formed by ion implantation process before the formation of the cap layer 26 as shown in FIG. 2, a source/drain region could be formed by in-situ doping boron during the formation of epitaxial layer 30 as shown in FIG. 6, or a source/drain region could be formed by another doping process after the formation of epitaxial layer 30. Preferably, it would be desirable to form a source/drain region in any of the aforementioned three time slots or any combination of the aforementioned three time slots, in which each ion implantation or doping process used for forming the source/drain region could be accompanied by an annealing process thereafter, these all within the scope of the present invention. This completes the fabrication of a semiconductor device according to a preferred embodiment of the present invention.

Referring again to FIG. 6, FIG. 6 further illustrates a structural view of a semiconductor device. As shown in FIG. 6, the semiconductor device of the present invention includes a substrate 12, at least a fin-shaped structure 14 disposed on the substrate 12, a gate structure 22 disposed on the substrate 12 and intersecting the fin-shaped structure 14, a shallow trench isolation (STI) 16 around the fin-shaped structure 14, an epitaxial layer 30 disposed around the top portion 18 of fin-shaped structure 14 adjacent to two sides of the gate structure 22, and a cap layer 32 covering the epitaxial layer 30 surface.

In this embodiment, the top portion 18 and bottom portion 20 of the fin-shaped structure 14 adjacent to two sides of the gate structure 22 are composed of different material, in which the top portion 18 preferably includes germanium while the bottom portion is composed of pure silicon. Specifically, the germanium concentration of the top portion 18 adjacent to two sides of the gate structure 22 is greater than 50%, the germanium concentration of the epitaxial layer 30 is higher than the germanium concentration of the top portion 18 adjacent to two sides of the gate structure 22, the germanium concentration of the cap layer 32 is higher than the germanium concentration of epitaxial layer 30, and the epitaxial layer 30 includes boron while the top portion 18 adjacent to two sides of gate structure 22 does not include any boron therein.

Structurally, the top portion 18 of the fin-shaped structure 14 covered by or directly under the gate structure 22 is rectangular, the top portion 18 of the fin-shaped structure 14 adjacent to two sides of the gate structure 22 is rhombus-shaped, the epitaxial layer 30 and cap layer 32 are rhombus-shaped, and the height of the top portion 18 adjacent to two sides of the gate structure 22 is less than half the height of the bottom portion 20. Viewing from a more detailed perspective, the top portion 18 and bottom portion 20 of the fin-shaped structure 14 directly under the gate structure 22 preferably share equal widths, whereas the top portion 18 and bottom portion 20 of the fin-shaped structure 14 adjacent to two sides of the gate structure 22 on the other hand share different widths. For instance, the width of the bottom surface of the top portion 18 adjacent to two sides of the gate structure 22 is preferably less than the width of the top surface of the bottom portion 20 while both the bottom surface of the top portion 18 and the top surface of the bottom portion 20 are even with the top surface of STI 16.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
    a substrate;
    at least a fin-shaped structure on the substrate, wherein the fin-shaped structure comprises a top portion and a bottom portion, and the top portion comprises a rhombus shape; and
    a gate structure on the substrate and the fin-shaped structure, wherein the fin-shaped structure covered by the gate structure and the fin-shaped structure not covered by the gate structure comprise different shape, the fin-shaped structure not covered by the gate structure is smaller than the fin-shaped structure covered by the gate structure, and a height of the rhombus shape of the top portion is less than a height of the fin-shaped structure covered by the gate structure.

2. The semiconductor device of claim 1, wherein the top portion of the fin-shaped structure comprises germanium.

3. The semiconductor device of claim 2, further comprising an epitaxial layer around the top portion of the fin-shaped structure, wherein the germanium concentration of the epitaxial layer is higher than the germanium concentration of the top portion of the fin-shaped structure.

4. The semiconductor device of claim 3, wherein the epitaxial layer comprises boron and the top portion of the fin-shaped structure comprises no boron.

5. The semiconductor device of claim 3, further comprising a cap layer around the epitaxial layer.

6. The semiconductor device of claim 1, wherein the top portion and the bottom portion comprise different material and the top portion is rhombus-shaped.

7. The semiconductor device of claim 1, further comprising a shallow trench isolation (STI) around the fin-shaped structure, wherein the bottom surface of the top portion of the fin-shaped structure and the top surface of the STI are coplanar.

8. The semiconductor device of claim 1, wherein the height of the top portion is less than half the height of the bottom portion.

* * * * *